(12) United States Patent
Kishi et al.

(10) Patent No.: US 11,533,833 B2
(45) Date of Patent: *Dec. 20, 2022

(54) ELECTROMAGNETIC WAVE SHIELDING SHEET AND PRINTED WIRING BOARD

(71) Applicants: TOYO INK SC HOLDINGS CO., LTD., Tokyo (JP); TOYOCHEM CO., LTD., Tokyo (JP)

(72) Inventors: Daisuke Kishi, Tokyo (JP); Shota Mori, Tokyo (JP); Takahiro Matsuzawa, Tokyo (JP); Tsutomu Hayasaka, Tokyo (JP)

(73) Assignees: TOYO INK SC HOLDINGS CO., LTD., Tokyo (JP); TOYOCHEM CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/020,829

(22) Filed: Sep. 15, 2020

(65) Prior Publication Data

US 2020/0413576 A1    Dec. 31, 2020

Related U.S. Application Data

(62) Division of application No. 16/673,927, filed on Nov. 4, 2019, now Pat. No. 10,820,457.

(30) Foreign Application Priority Data

May 30, 2019   (JP) .............................. JP2019-101051

(51) Int. Cl.
*H05K 9/00* (2006.01)
*H05K 1/02* (2006.01)
(Continued)

(52) U.S. Cl.
CPC .......... *H05K 9/0084* (2013.01); *B32B 15/08* (2013.01); *C09J 9/02* (2013.01); *H05K 1/0218* (2013.01);
(Continued)

(58) Field of Classification Search
CPC .................................................. H05K 9/0084
See application file for complete search history.

(56) References Cited

U.S. PATENT DOCUMENTS

| | | | | |
|---|---|---|---|---|
| 5,639,989 A | * | 6/1997 | Higgins, III ........... | H05K 3/284 174/386 |
| 2009/0038839 A1 | | 2/2009 | Hashimoto et al. | |

(Continued)

FOREIGN PATENT DOCUMENTS

| | | |
|---|---|---|
| JP | 2015063730 | 4/2015 |
| JP | 2017147276 | 8/2017 |

(Continued)

OTHER PUBLICATIONS

"Office Action of Korean Counterpart Application," dated Nov. 13, 2020, with English translation thereof, p. 1-p. 7.

*Primary Examiner* — Hung V Ngo
(74) *Attorney, Agent, or Firm* — JCIPRNET

(57) ABSTRACT

An electromagnetic wave shielding sheet according to the disclosure is configured by a protection layer, a metal layer, and a conductive adhesive layer. The metal layer has a plurality of openings, and an aperture ratio of the opening is 0.1%-20%. In addition, a tensile breaking strength of the electromagnetic wave shielding sheet is 10 N/20 mm-80 N/20 mm.

10 Claims, 8 Drawing Sheets

(51) Int. Cl.
*B32B 15/08* (2006.01)
*C09J 9/02* (2006.01)

(52) U.S. Cl.
CPC ......... *H05K 9/0022* (2013.01); *H05K 9/0088* (2013.01); *H05K 2201/0335* (2013.01); *H05K 2201/0715* (2013.01)

(56) References Cited

U.S. PATENT DOCUMENTS

| | | |
|---|---|---|
| 2012/0048603 A1 | 3/2012 | Huang |
| 2012/0247868 A1 | 10/2012 | Kato et al. |
| 2014/0326484 A1 | 11/2014 | Tajima et al. |
| 2016/0120077 A1 | 4/2016 | Watanabe |
| 2016/0205817 A1 | 7/2016 | Tajima et al. |
| 2016/0268017 A1* | 9/2016 | Kitamura ............. H05K 9/0083 |
| 2017/0288314 A1 | 10/2017 | Kagawa |
| 2018/0222154 A1* | 8/2018 | Yamamoto ............ C23C 14/205 |
| 2019/0150331 A1 | 5/2019 | Watanabe |

FOREIGN PATENT DOCUMENTS

| | | |
|---|---|---|
| WO | 2013077108 | 5/2013 |
| WO | 2014192494 | 12/2014 |
| WO | 2018147298 | 8/2018 |

\* cited by examiner

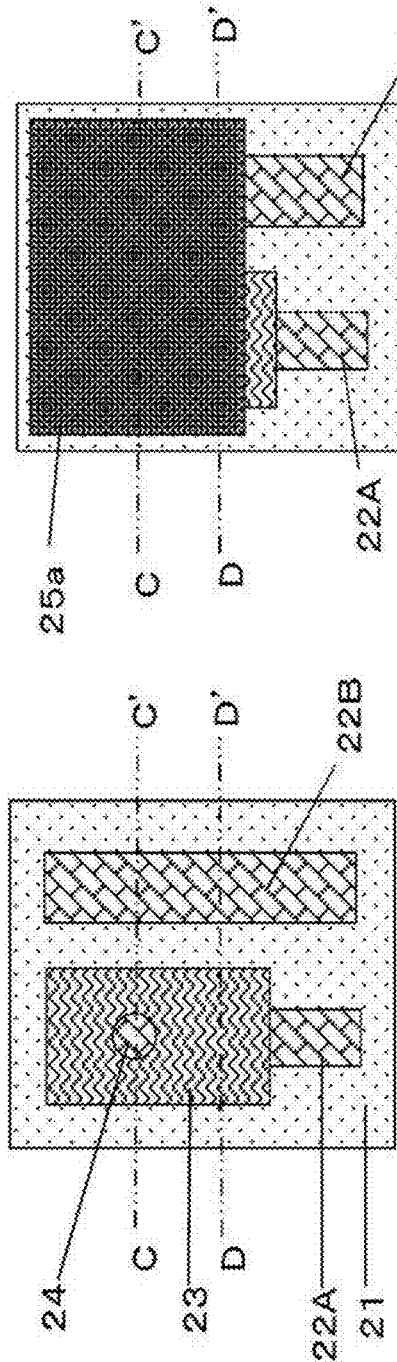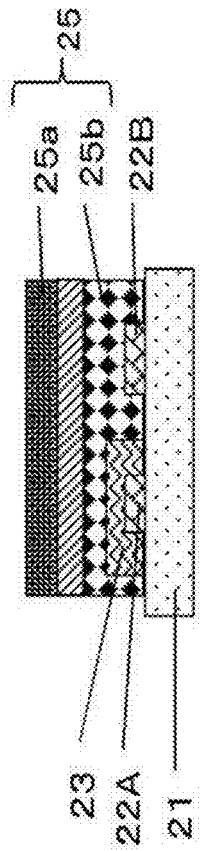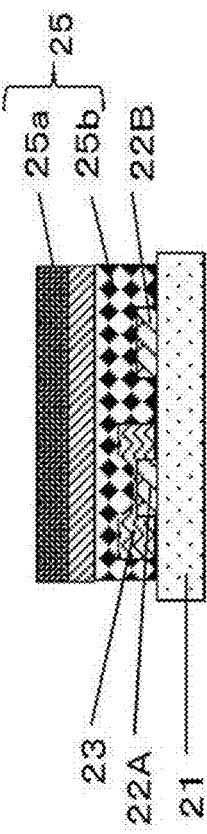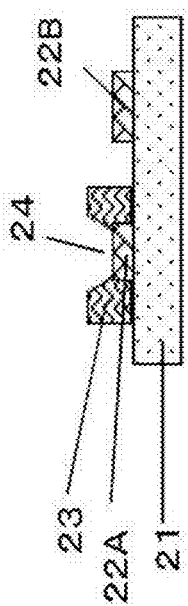

ELECTROMAGNETIC WAVE SHIELDING SHEET AND PRINTED WIRING BOARD

CROSS-REFERENCE TO RELATED APPLICATION

This is a divisional application of patent application Ser. No. 16/673,927, filed on Nov. 4, 2019, which claims the priority benefit of Japanese Patent Application No. 2019-101051, filed on May 30, 2019 and is now allowed. The entirety of each of the above-mentioned patent applications is hereby incorporated by reference herein and made a part of this specification.

BACKGROUND

Technical Field

The disclosure relates to an electromagnetic wave shielding sheet suitable to be used by being bonded to one part of a component which emits electromagnetic waves and relates to a printed wiring board with electromagnetic wave shielding sheet.

In various electronic machines such as a portable terminal, a personal computer (PC), a server and the like, substrates such as printed wiring boards or the like are incorporated. An electromagnetic wave shielding structure is arranged on the substrate to prevent malfunction due to a magnetic field or a radio wave from outside and to reduce unnecessary radiation from an electric signal.

In International Publication No. 2013/077108, in order to provide a shielding film, a shielding printed wiring board and a manufacture method of shielding film, the shielding film excellently blocking electric field waves, magnetic field waves and electromagnetic waves which travel from one surface side to the other surface side of the shielding film and having a good transmission characteristic even when applied to a high frequency signal system, a configuration below is disclosed. That is, a shielding film characterized in including a metal layer with a layer thickness of 0.5 μm-12 μm and an anisotropic conductive layer in a laminated state is disclosed. Moreover, it is recited that the electric field waves, the magnetic field waves, and the electromagnetic waves which travel from one surface side to the other surface side of the shielding film can be excellently blocked by a configuration in which a ground circuit of the printed wiring board and the anisotropic conductive layer are grounded.

In International Publication No. 2014/192494, in order to solve a problem that an interlayer adhesion of a shielding printed wiring board is damaged by a volatile component generated in a heating press or solder reflow process, a shielding film for printed wiring board including a metal foil having pinholes with a diameter of 0.1 μm-100 μm and a number of 10/cm$^2$-1000/cm$^2$ in a metal film layer of an electromagnetic wave shielding sheet and a conductive adhesive layer is recited.

Along with a trend of high-speed transmission of a transmission signal, the electromagnetic wave shielding sheet is also required to have a high shielding property for high frequency and a transmission characteristic for high frequency. Therefore, it is suitable to use the metal layer in the conductive layer of the electromagnetic wave shielding sheet as recited in International Publication No. 2013/077108.

However, when the shielding printed wiring board in which the electromagnetic wave shielding sheet using the metal layer is attached to the printed wiring board carries out a heating treatment such as solder reflow or the like, there is a problem that floating is generated between layers due to the volatile component generated from the inside of the printed wiring board, and poor appearance and poor connection are resulted due to foaming or the like (hereinafter, sometimes referred to as solder reflow resistance).

In order to solve the problem, in International Publication No. 2014/192494, it is proposed that a metal layer having pinholes is applied to the electromagnetic wave shielding sheet; however, by the diameter and the number of the above pinholes, the solder reflow resistance cannot exhibit performance that can withstand practical use.

In addition, there is a problem that if the electromagnetic wave shielding sheet having the pinholes is thermally pressed, cracks triggered by the pinholes are generated in the metal layer and the electromagnetic wave shielding property deteriorates (hereinafter, referred to as crack resistance).

In addition, along with miniaturization of the electronic machines, a circuit area of the printed wiring board is also reduced, and an opening area of a via for ground-connection is miniaturized. In the electromagnetic wave shielding sheets of International Publication No. 2013/077108 and International Publication No. 2014/192494, reliability of the ground-connection with respect to the above small opening via is poor and the electromagnetic wave shielding property deteriorates.

SUMMARY

The disclosure provides an electromagnetic wave shielding sheet and a printed wiring board using the electromagnetic wave shielding sheet, the electromagnetic wave shielding sheet having excellent solder reflow resistance and crack resistance, capable of high reliable ground-connection even with respect to the small opening via, and having a high electromagnetic wave shielding property even when used in a high frequency transmission circuit.

As a result of intensive studies, the inventors found that the problems of the disclosure can be solved in the following aspects and completed the disclosure.

The electromagnetic wave shielding sheet of the disclosure is configured by a protection layer, a metal layer, and a conductive adhesive layer, wherein the metal layer has a plurality of openings, an aperture ratio of the openings is 0.1%-20%, and a tensile breaking strength is 10 N/20 mm-80 N/20 mm.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF THE DRAWINGS

FIGS. 9(1) to 9(6) are schematic views of a connection reliability evaluation to a small opening via.

DESCRIPTION OF THE EMBODIMENTS

One example of an embodiment in which the disclosure is applied is described below. Furthermore, a size and a ratio of each member in the following diagrams are used for convenience of description and are not limited hereto. Additionally, in this application, with regard to a recitation of "arbitrary number A to arbitrary number B", the number A is included as a lower limit value and the number B is included as an upper limit value in the range. In addition, "sheet" in this application includes not only the "sheet" defined in JIS but also "film". In addition, numerical values specified in this application are values obtained by the method disclosed in the embodiment or examples.

Figure 1:
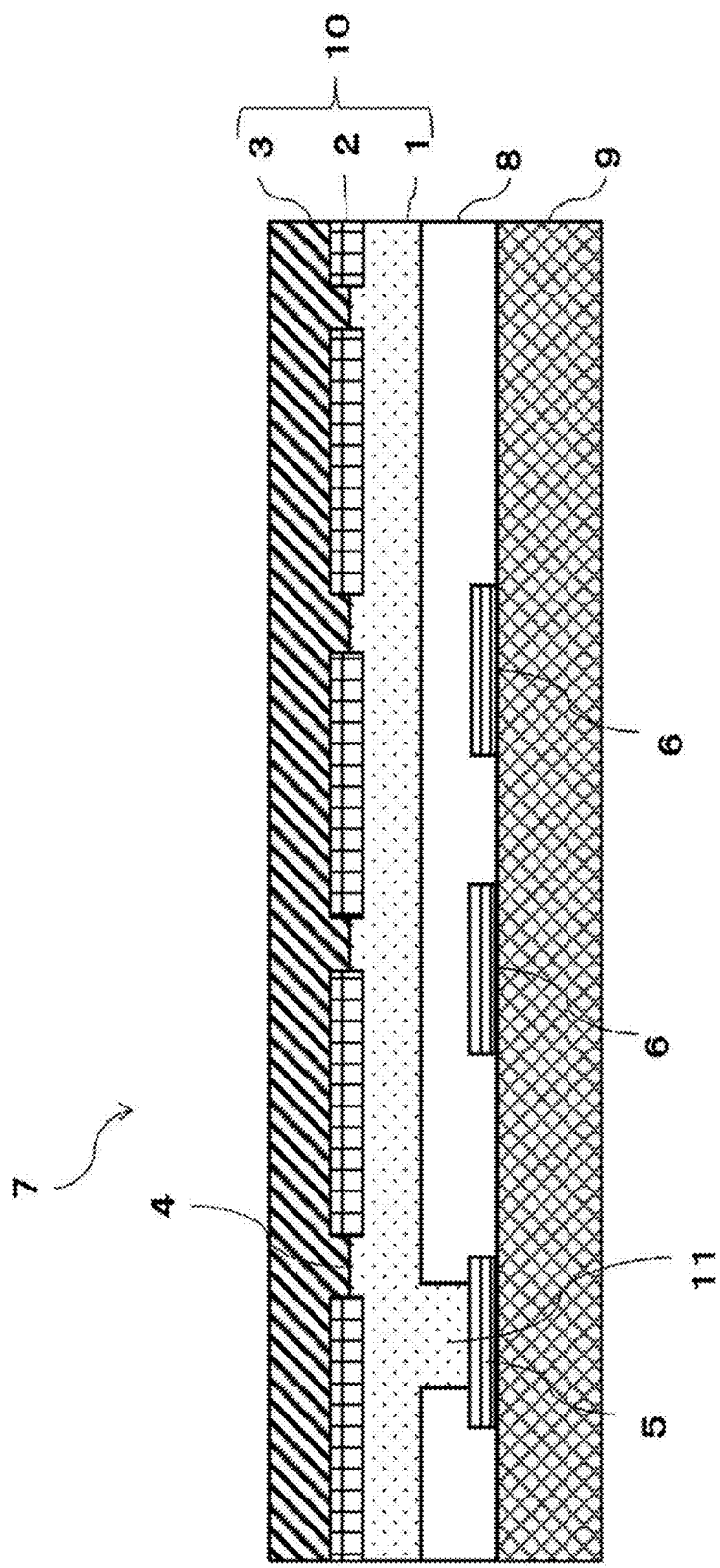
FIG. 1 is a schematic cross-section view of a cutoff portion showing one example of a printed wiring board according to the embodiment.

An electromagnetic wave shielding sheet 10 according to the disclosure includes a lamination body in which a conductive adhesive layer 1, a metal layer 2, and a protection layer 3 are laminated in this order (see FIG. 1). In the electromagnetic wave shielding sheet 10, the conductive adhesive layer 1 can be arranged on a component (not shown) and bonded to the component by a bonding treatment. The bonding treatment may be any treatment as long as the conductive adhesive layer 1 can be bonded to the component, for example, a heat treatment or a thermocompression bonding treatment can be suitably used. The protection layer 3 plays a role of protecting the conductive adhesive layer 1 and the metal layer 2, and is disposed closer to a surface-layer side than the metal layer 2. The metal layer 2 is a layer sandwiched between the protection layer 3 and the conductive adhesive layer 1 and mainly plays a role of shielding electromagnetic waves. In a printed wiring board, the metal layer 2 plays a role of shielding electromagnetic noise generated from signal wirings and the like inside the component and shielding a signal from the outside.

The metal layer 2 has a plurality of openings 4, and an aperture ratio of the openings 4 is 0.1%-20%. In addition, a tensile breaking strength of the electromagnetic wave shielding sheet 10 according to the embodiment is 10 N/20 mm-80 N/20 mm.

The openings 4 are also places where the protection layer 3 and the conductive adhesive layer 1 are adhered and play a role of improving solder reflow resistance. In addition, by setting the aperture ratio which is calculated from areas of the openings 4 and non-openings to 0.1%-20%, both the solder reflow resistance and a high electromagnetic wave shielding property can be achieved. Moreover, by setting the tensile breaking strength of the electromagnetic wave shielding sheet 10 to 10 N/20 mm-80 N/20 mm, crack resistance can be improved, and deterioration of an electromagnetic wave shielding property can be suppressed.

The electromagnetic wave shielding sheet and the printed wiring board according to the embodiment are specifically described below. At first, the metal layer, the conductive adhesive layer, and the protection layer which configure the electromagnetic wave shielding sheet according to the embodiment are specifically described.

(Metal Layer)

The metal layer of the disclosure has a plurality of openings, and the aperture ratio of the openings is 0.1%-20%. By setting the aperture ratio of the openings to this range, a high electromagnetic wave shielding property can be maintained, and both the solder reflow resistance and the crack resistance can be achieved. The aperture ratio can be adjusted from an area and the number of the openings. In addition, the aperture ratio is obtained by expression (1) below.

$$\text{aperture ratio (\%)} = \text{opening area per unit area}/(\text{opening area per unit area} + \text{non-opening area per unit area}) \times 100 \qquad \text{expression (1)}$$

A lower limit of the aperture ratio is more preferably 0.3% and further preferably 0.5%. An upper limit of the aperture ratio is more preferably 15% and further preferably 6.5%.

By setting the aperture ratio to the range of 0.1%-20%, the solder reflow resistance, the high electromagnetic wave shielding property and the connection reliability of small opening via can be kept.

Measurement of the aperture ratio can be performed, for example, by using an image which is obtained by magnifying the metal layer 500 times to 5000 times with a laser microscope and a scanning electron microscope (SEM) perpendicular to a plane direction to binarize the openings and the non-openings, and taking the number of pixels of binarized colors per unit area as the respective areas.

In addition, with regard to the openings of the metal layer of the disclosure, an average value of a circularity factor of the openings obtained by expression (2) may be 0.5 or more.

$$\text{circularity factor} = (\text{area} \times 4\pi)/(\text{perimeter})^2 \qquad \text{expression (2)}$$

Herein, the perimeter is a length of an outer circumference when an image which is obtained by observing the metal layer by any one of an optical microscope, a laser microscope and an electron microscope is read, a plane of the openings becomes a direction perpendicular to an observation viewpoint, the opening capable of being entirely confirmed is extracted, and the extracted opening is projected two-dimensionally. The area is a breadth of a region defined by the outer circumference when the extracted opening is projected two-dimensionally.

As described above, the metal layer of the disclosure has a plurality of openings. Preferably, there are openings on the entire surface of the metal layer. The openings play a role of releasing the volatile component included in a polyimide film or a cover-lay adhesive of the printed wiring board to the outside when the printed wiring board is subjected to a heating treatment such as solder reflow or the like. Accordingly, poor appearance and decrease of the connection reliability caused by interfacial peeling of the cover-lay adhesive and the electromagnetic wave shielding sheet can be suppressed. In addition, as shown in the schematic cross-section view of FIG. 1, by the adhesion between the protection layer and the conductive adhesive layer inside the openings internal, interfacial adhesive forces between the protection layer/the metal layer/the conductive adhesive layer are further improved, and the solder reflow resistance is further improved.

The opening has a circular shape, and the average value of the circularity factor obtained by expression (2) is preferably 0.5 or more. By setting the average value of the circularity factor to 0.5 or more, even if a tension in the plane direction is applied to the metal layer, cracks are hard to generate in peripheral walls of the openings and thus the crack resistance can be improved. The average value of the circularity factor is more preferably 0.7 or more.

In addition, by setting the circularity factor in the above range, the electromagnetic wave shielding property over time under high temperature and high humidity can be improved. The reason is considered to be that if the value of the circularity factor is small, the openings are distorted, and a void portion which is not completely filled in the openings is generated when the conductive layer and the protection layer are bonded. When the electromagnetic wave shielding sheet is stored for a long time under a high temperature and high humidity environment, moisture intrudes into the void, and rust is generated around the openings. Accordingly, the conductivity partially deteriorates, and the electromagnetic wave shielding property also deteriorates.

By the circularity factor in the above expression (2), a concave-convex degree (an unevenness degree) of an outer edge of the opening can be grasped. A perfect circle has a circularity factor of 1, and the circularity factor decreases with an increase of a concave-convex shape. That is, the circularity factor is 0 or more and 1 or less. With regard to the circularity factor in this disclosure, analysis software of Mac-View Ver.4 (Mountech Corporation) is used, the image of (about 500 times to 10,000 times) the openings of the metal layer is read by a laser microscope or an electron microscope, and about 20 openings are selected in a manual recognition mode. Under a setting in which particle reference data is a projection area circle equivalent diameter and distribution is volume distribution, the circularity factor is calculated, and an average value of the 20 openings is obtained. With regard to the area in the above expression (2), an area inside the line that forms the outer circumference during the two-dimensional projection is set as an area of a plane surface, and a length of the outer circumference of the opening when the plane surface is projected two-dimensionally is set as a length of the perimeter.

The area of each opening is preferably 0.7 $\mu m^2$-5000 $\mu m^2$, more preferably 10 $\mu m^2$-4000 $\mu m^2$, and further preferably 20 $\mu m^2$-2000 $\mu m^2$. By setting the opening area to 0.7 $\mu m^2$ or more, the protection layer and the conductive adhesive layer are excellently adhered, and the solder reflow resistance is more excellent. By setting the opening area to 5000 $\mu m^2$ or less, the high electromagnetic wave shielding property can be excellent, and thus the above range is preferable.

The number of the openings is preferably 100/$cm^2$-200000/$cm^2$, more preferably 1000/$cm^2$-150000/$cm^2$, and further preferably 1000/$cm^2$-20000/$cm^2$. By setting the number of the openings to 100/$cm^2$ or more, the volatile component is efficiently released to the outside easily, and thus the solder reflow resistance can be further improved. By setting the number of the openings to 200000/$cm^2$ or less, the high electromagnetic wave shielding property can be ensured, and thus the above range is preferable.

The thickness of the metal layer is preferably 0.5 $\mu m$-5 $\mu m$. The thickness of the metal layer is more preferably 1.0 $\mu m$-4.5 $\mu m$, and further preferably 1 $\mu m$-4 $\mu m$. By the thickness of the metal layer being in the range of 0.5 $\mu m$-5 $\mu m$, a balance between the high electromagnetic wave shielding property and the crack resistance can be established.

The metal layer can use, for example, a metal foil, a metal deposition film, and a metal plating film.

Preferably, a metal used in the metal foil is, for example, a conductive metal such as aluminum, copper, silver, gold and the like; in terms of the electromagnetic wave shielding property and cost, copper, silver, aluminum are more preferable and copper is further preferable. With regard to the copper, for example, a rolled copper foil or an electrolytic copper foil is preferably used, and the electrolytic copper foil is more preferable. If the electrolytic copper foil is used, the thickness of the metal layer can be thinner. In addition, the metal foil may also be formed by plating.

With regard to a metal used in the metal deposition film and the metal plating film, for example, aluminum, copper, silver, and gold are preferable, and copper and silver are more preferable. The metal layer is preferably the deposition film in terms of film thinning. The metal foil is preferable in terms of the electromagnetic wave shielding property.

<Manufacturing Method of Metal Layer>

With regard to a manufacturing method of the metal layer having the openings, a conventionally well-known method can be applied, a method (i) in which a pattern resist layer is formed on the metal foil and the metal foil is etched to form the openings, a method (ii) in which conductive paste is printed in a predefined pattern by screen printing, a method (iii) in which an anchor agent is screen printed in a predefined pattern and a metal is plated only on the anchor agent printed surface, a manufacturing method (iv) recited in Japanese Laid-Open No. 2015-63730, and the like can be applied.

That is, a water-soluble or solvent-soluble ink is pattern printed on a support body, a metal deposition film is formed on the surface and the pattern is removed. A release layer is formed on the surface and the openings with carriers can be obtained by electrolytic plating. Among these, the opening formation method (i) in which the pattern resist layer is formed and the metal foil is etched is preferable because shapes of the openings can be precisely controlled. However, the manufacturing method of the metal layer is not limited to the etching method (i) as long as the shapes of the openings are controlled in other method.

(Conductive Adhesive Layer)

The conductive adhesive layer can be formed using a conductive resin composition. The conductive resin composition includes a thermosetting resin and a conductive filler. The conductive adhesive layer may be an isotropic conductive adhesive layer or an anisotropic conductive adhesive layer. The isotropic conductive adhesive layer has conductivity in a vertical direction and a horizontal direction in a state that the electromagnetic wave shielding sheet is arranged horizontally. In addition, the anisotropic conductive adhesive layer only has conductivity in the vertical direction in the state that the electromagnetic wave shielding sheet is arranged horizontally.

The conductive adhesive layer may be an isotropic conductive adhesive layer or an anisotropic conductive adhesive layer, and in the case of the anisotropic conductive adhesive layer, the cost can be reduced and thus the anisotropic conductive adhesive layer is preferable.

<Thermosetting Resin>

The thermosetting resin is a resin which has a plurality of functional groups capable of reacting with a curing agent. The functional group may be, for example, a hydroxyl group, a phenolic hydroxyl group, a methoxymethyl group, a carboxyl group, an amino group, an epoxy group, an oxetanyl group, an oxazoline group, an oxazine groups, an aziridine group, a thiol group, an isocyanate group, a blocked isocyanate group, a blocked carboxyl group, a silanol groups or the like. The thermosetting resin may be, for example, a well-known resin such as an acrylic resin, a maleic acid resin, a polybutadiene resin, a polyester resin, a polyurethane resin, a polyurethane urea resin, an epoxy resin, an oxetane resin, a phenoxy resin, a polyimide resin, a polyamide resin, a polyamide imide resin, a phenolic resin, an alkyd resin, an amino resin, a polylactic acid resin, an oxazoline resin, a benzoxazine resin, a silicone resin, a fluorine resin or the like.

The thermosetting resin can be used alone or in combination of two or more kinds.

Among these resins, in terms of solder reflow resistance, the polyurethane resin, the polyurethane urea resin, the polyester resin, the epoxy resin, the phenoxy resin, the polyimide resin, the polyamide resin, and the polyamide imide resin are preferable.

An acid value of the thermosetting resin is preferably 1 mgKOH/g-50 mgKOH/g and more preferably 3 mgKOH/g-30 mgKOH/g. By setting the acid value to 1 mgKOH/g-50 mgKOH/g, the solder reflow resistance is further improved.

The content of the thermosetting resin in solid matter of the conductive adhesive layer is preferably 10 weight %-80 weight %, and more preferably 15 weight %-80 weight %. By the content being in the above blending range, the solder reflow resistance and the crack resistance can be improved.

<Curing Agent>

The curing agent has a plurality of functional groups capable of reacting with the functional groups of the thermosetting resin. The curing agent may be, for example, a well-known compound such as an epoxy compound, an acid anhydride group containing compound, an isocyanate compound, an aziridine compound, an amine compound, a phenolic compound, an organic metal compound or the like.

The curing agent can be used alone or in combination of two or more kinds.

Preferably, 7 parts by weight-50 parts by weight of each kind of the curing agent are included with respect to 100 parts by weight of the thermosetting resin, 9 parts by weight-40 parts by weight are more preferable, and 10 parts by weight-30 parts by weight are further preferable.

<Conductive Filler>

The conductive filler has a function of imparting conductivity to the conductive adhesive layer. With regard to the conductive filler, as a raw material, for example, a conductive metal such as gold, platinum, silver, copper, nickel and the like and an alloy thereof, and fine particles of conductive polymers are preferable, and silver is more preferable in terms of price and conductivity.

In addition, in terms of cost reduction, instead of the fine particle of a single raw material, a composite fine particle which uses metal or resin as a core and has a covering layer covering a surface of the core is preferable. Herein, preferably, the core is appropriately selected from cheap nickel, silica, copper and an alloy thereof, and a resin. The covering layer is preferably a conductive metal or a conductive polymer. The conductive metal may be, for example, gold, platinum, silver, nickel, manganese, indium or the like, and an alloy thereof. In addition, the conductive polymer may be polyaniline, polyacetylene or the like. Among these materials, silver is preferable in terms of price and conductivity.

The shape of the conductive filler is not limited as long as the desirable conductivity is obtained. Specifically, for example, a sphere shape, a flake shape, a leaf shape, a branch shape, a plate shape, a needle shape, a rod shape, and a grape shape are preferable. In addition, two types of conductive fillers of different shapes may be mixed.

The conductive filler can be used alone or in combination of two or more kinds.

An average particle diameter of the conductive filler is a $D_{50}$ average particle diameter, and in terms of sufficiently ensuring the conductivity, the average particle diameter of the conductive filler is preferably 2 μm or more, more preferably 5 μm or more, and further preferably 7 μm or more. On the other hand, from a viewpoint of achieving both the conductivity and thinness of the conductive adhesive layer, the average particle diameter of the conductive filler is preferably 30 μm or less, more preferably 20 μm or less, and further preferably 15 μm or less. The $D_{50}$ average particle diameter can be obtained by a laser diffraction-scattering particle size distribution measurement device or the like.

The content of the conductive filler in the conductive adhesive layer is preferably 35 weight %-90 weight %, more preferably 39 weight %-85 weight %, and further preferably 40 weight %-80 weight %. By setting the content to 35 weight % or more, the connection reliability of the small opening via is improved. On the other hand, by setting the content to 90 weight % or less, the adhesive force of the conductive adhesive layer is increases and thus the solder reflow resistance is improved.

The conductive resin composition can be blended with other optional components such as a silane coupling agent, an antirust agent, a reducing agent, an oxidation inhibitor, a pigment, a dye, a tackifying resin, a plasticizing agent, an ultraviolet absorbing agent, an antifoaming agent, a leveling adjustment agent, a filler, a flame-retardant agent and the like.

The conductive resin composition can be obtained by mixing and stirring the materials described above. The stirring can use, for example, a well-known stirring device such as a disperse mat, a homogenizer or the like.

A well-known method can be used for manufacturing the conductive adhesive layer. For example, a method in which the conductive adhesive layer is formed by coating and drying the conductive resin composition on a peelable sheet can be used; alternatively, the conductive adhesive layer can also be formed by extruding the conductive resin composition into a sheet shape using an extrusion molding machine such as T-die.

The coating method includes, for example, a well-known coating method such as a gravure coating method, a kiss coating method, a die coating method, a lip coating method, a comma coating method, a blade method, a roll coating method, a knife coating method, a spray coating method, a bar coating method, a spin coating method, a dip coating method or the like. Preferably, a drying process is carried out during coating. For example, a well-known dry device such as a hot air dryer, an infrared heater or the like can be used for the drying process.

The thickness of the conductive adhesive layer is preferably 2 μm-30 μm, more preferably 3 μm-15 μm and further preferably 4 μm-9 μm. By the thickness being in the range of 2 μm-30 μm, the solder reflow resistance and the connection reliability of the small opening via can be improved.

(Protection Layer)

The protection layer can be formed using a conventionally well-known resin composition.

The resin composition can include the thermosetting resin and the curing agent described in the conductive resin composition and the above optional components as required. Furthermore, the thermosetting resins and the curing agents used in the protection layer and the conductive adhesive layer may be the same or different.

The resin composition can be obtained in the same method as the conductive resin composition.

In addition, for the protection layer, a film which is obtained by molding an insulation resin such as polyester, polycarbonate, polyimide, polyphenylene sulfide or the like can also be used.

The thickness of the protection layer is usually about 2 µm-12 µm.

(Electromagnetic Wave Shielding Sheet)

The electromagnetic wave shielding sheet of the disclosure at least includes the protection layer, the metal layer having the openings, and the conductive adhesive layer.

The electromagnetic wave shielding sheet of the disclosure includes the metal layer having a plurality of openings and the aperture ratio of the metal layer is 0.1%-20%, and thus crosstalk and the like can be further suppressed by a wiring board for transmitting a particularly high frequency (for example, from 100 MHz to 50 GHz) signal.

In addition, the electromagnetic wave shielding sheet of the disclosure has a tensile breaking strength of 10 N/20 mm-80 N/20 mm. By setting the tensile breaking strength to the above range, the crack resistance can be improved, and the deterioration of the electromagnetic wave shielding property can be suppressed. A more preferable range of the tensile breaking strength is 20 N/20 mm-70 N/20 mm, and a further preferable range is 30 N/20 mm-65 N/20 mm.

In the disclosure, the tensile breaking strength of the electromagnetic wave shielding sheet can be controlled using, for example, the aperture ratio of the openings in the metal layer, the thickness, and the circularity factor of the openings.

Specifically, the smaller the aperture ratio of the metal layer is, the higher the tensile breaking strength becomes, and the higher the aperture ratio of the metal layer is, the lower the tensile breaking strength becomes. The reason is that, when the aperture ratio of the metal layer is lower, a contacting area of the metal layer and the conductive adhesive layer increases, and the metal layer and the conductive adhesive layer are hard to be peeled.

In addition, the thinner the thickness of the metal layer is, the lower the tensile breaking strength becomes, and the thicker the thickness of the metal layer is, the higher the tensile breaking strength becomes. The reason is that, when the thickness of the metal layer is thicker, the strength of the metal layer increases.

In addition, the lower the circularity factor of the openings of the metal layer is, the lower the tensile breaking strength becomes, and the higher the circularity factor of the openings is, the higher the tensile breaking strength becomes. The reason is that, when the circularity factor of the openings is higher, the shape of the openings is closer to a circle, and when tensile deformation stress is applied to the electromagnetic wave shielding sheet, crack initiation points decrease.

Besides, in the disclosure, in addition to the factors described above, the tensile breaking strength of the electromagnetic wave shielding sheet may also be controlled by compositions or configurations of the protection layer and the conductive adhesive layer. For example, by increasing the content of the curing agent in the conductive adhesive layer, a curing degree of a curing system consisting of the resin and the curing agent can be increased, the strength of the conductive adhesive layer is increased, and the tensile breaking strength of the electromagnetic wave shielding sheet can be increased.

Furthermore, with regard to a method for increasing the strength of the conductive adhesive layer, in addition to the above-described method, change of the type of the resin or the type of the curing agent and a method of adding a filler or the like can also be used. In addition, with regard to the protection layer, the strength can also be controlled by the same method as the above-described conductive adhesive layer.

In addition, the electromagnetic wave shielding sheet of the disclosure can have an excellent electromagnetic wave shielding property that when the electromagnetic wave shielding sheet is bonded to a wiring board having a coplanar circuit, signal wirings of a wiring board having a microstrip line circuit and the protection layer of the electromagnetic wave shielding sheet are laminated, and a sine wave of 10 GHz flows through the signal wirings of the microstrip line circuit, the crosstalk of the coplanar circuit is less than −45 dB.

Specifically, for example, the electromagnetic wave shielding property can be evaluated as described below.

First, the coplanar circuit is prepared.

The coplanar circuit is one of plane transmission circuits in which signal wirings are printed on one side of an insulation base material such as a polyimide film or the like, and in the disclosure, the coplanar circuit is a circuit in which a ground wiring is formed in parallel in a form of clamping two signal wirings on the polyimide film. Furthermore, for the above coplanar circuit, grounding patterns for ground-connection are arranged on an opposite surface via through holes.

A conductive adhesive layer surface of the electromagnetic wave shielding sheet is bonded to an insulation base material surface opposite to the signal wirings of the coplanar circuit, and an electromagnetic wave shielding layer is formed by thermocompression bonding. At this time, the electromagnetic wave shielding sheet is conducted with the partially exposed ground patterns.

Next, signal wirings of a printed wiring board prepared separately and having a microstrip line circuit is arranged on a protection layer surface of the electromagnetic wave shielding layer formed on the coplanar circuit, and a test piece for measurement is obtained. A network analyzer is connected to the coplanar circuit and the microstrip line circuit of the test piece, when a sine wave of 10 MHz to 20 GHz flows through the signal wirings of the microstrip line circuit, the crosstalk in the coplanar circuit is measured, and the electromagnetic wave shielding property can be evaluated.

Furthermore, a polyimide cover-lay film with adhesive is attached to the above coplanar circuit and the above microstrip line circuit, but one part of the circuits is exposed for connecting a probe of the network analyzer.

In the disclosure, the crosstalk of the coplanar circuit when the sine wave of 10 GHz flows through the signal wirings of the microstrip line circuit is preferably less than −45 dB, more preferably less than −50 dB, and further preferably less than −55 dB. By the crosstalk being less than −45 dB, the high electromagnetic wave shielding property can be obtained.

The electromagnetic wave shielding sheet according to the disclosure has a plurality of openings, and the aperture ratio of the opening is 0.1%-20%. In addition, the tensile breaking strength of the electromagnetic wave shielding sheet is 10 N/20 mm-80 N/20 mm. Therefore, the solder reflow resistance and the crack resistance are excellent. As a result, a resistance value in the plane direction of the metal layer seldom changes, the high electromagnetic wave shielding property can be stably maintained, and failure of electronic components is reduced when the electromagnetic wave shielding sheet is mounted into a narrow case.

The thermosetting resin and the curing agent included in the conductive adhesive layer are present in an uncured state (B stage) and are cured by thermal pressing with the wiring board (C stage), and thereby the electromagnetic wave shielding sheet can obtain a desirable adhesive strength. Furthermore, the uncured state includes a half-cured state in which part of the curing agent is cured.

The peelable sheet is a sheet obtained by carrying out a well-known peel treatment to a base material such as paper, plastic or the like.

Furthermore, in order to prevent adhesion of a foreign matter, the electromagnetic wave shielding sheet is generally stored in a state that the peelable sheet is attached to the conductive adhesive layer and the protection layer.

The electromagnetic wave shielding sheet can include other functional layers in addition to the protection layer, the metal layer, and the conductive adhesive layer. The other functional layer is a layer having a function such as a hard coat property, a water vapor barrier property, an oxygen barrier property, a thermal conductivity, a low dielectric constant property, a high dielectric constant property, a heat-resisting property or the like.

The electromagnetic wave shielding sheet of the disclosure can be used in various applications in which the shielding of electromagnetic waves is required. For example, the electromagnetic wave shielding sheet can be used in, in addition to a flexible printed wiring board, a rigid printed wiring board, a COF, a TAB, a flexible connector, a liquid crystal display, a touch panel or the like. In addition, the electromagnetic wave shielding sheet can also be used as a computer case, building materials such as walls and window glass of a building, a member of a vehicle, a ship, an aircraft or the like for shielding electromagnetic waves.

<Manufacturing Method of Electromagnetic Wave Shielding Sheet>

In the manufacturing of the electromagnetic wave shielding sheet, a well-known method can be used as a method for laminating the conductive adhesive layer and the metal layer.

For example, the methods (i)-(v) may be exemplified.

(i) A method in which a conductive adhesive layer is formed on a peelable sheet, the conductive adhesive layer is overlapped and laminated on an electrolytic copper foil surface side of an electrolytic copper foil having openings with copper carrier, and subsequently the copper carrier is peeled. Then, a surface from which the copper carrier is peeled and a protection layer separately formed on a peelable sheet are overlapped and laminated. (ii) A method in which a protection layer is formed on a peelable sheet, the protection layer is overlapped and laminated on an electrolytic copper foil surface side of an electrolytic copper foil having openings with copper carrier, and subsequently the copper carrier is peeled. Then, a surface from which the copper carrier is peeled and a conductive adhesive layer separately formed on a peelable sheet are overlapped and laminated. (iii) A method in which a resin composition is coated on an electrolytic copper foil surface side of an electrolytic copper foil having openings with copper carrier to form a protection layer, and a peelable sheet is attached. Thereafter, the copper carrier is peeled, and a conductive adhesive layer separately formed on a peelable sheet is overlapped and laminated. (iv) A method in which a conductive adhesive layer is formed on a peelable sheet, the conductive adhesive layer is overlapped and laminated on an electrolytic copper foil surface side of an electrolytic copper foil with copper carrier, and subsequently the copper carrier is peeled. Then, after a surface from which the copper carrier is peeled and a protection layer separately formed on a peelable sheet are overlapped and laminated, openings are formed in the electromagnetic wave shielding sheet with a needle-shape jig. (v) A method in which after a protection layer formed on a peelable sheet is overlapped and laminated on an electrolytic copper foil surface side of an electrolytic copper foil having openings with copper carrier, the copper carrier is peeled. Then, a conductive adhesive layer is formed on a surface from which the copper carrier is peeled.

(Printed Wiring Board)

The printed wiring board of the disclosure includes the electromagnetic wave shielding sheet, a cover coat layer, and a wiring board which has a circuit pattern having a signal wiring and a ground wiring and an insulation base material. The electromagnetic wave shielding sheet is configured by the protection layer, the metal layer, and the conductive adhesive layer, wherein the metal layer has a plurality of openings, the aperture ratio of the openings is 0.1%-20%, and the tensile breaking strength of the electromagnetic wave shielding sheet is 10 N/20 mm-80 N/20 mm.

In the printed wiring board of the disclosure, the electromagnetic wave shielding layer is formed by performing thermocompression bonding on the electromagnetic wave shielding sheet which is configured by the protection layer, the metal layer, and the conductive adhesive layer. The metal layer has a plurality of openings, the aperture ratio of the openings is 0.1%-20%, and the tensile breaking strength of the electromagnetic wave shielding sheet is 10 N/20 mm-80 N/20 mm.

The wiring board has the circuit pattern having the signal wiring and the ground wiring on the surface of the insulation base material. On the wiring board, the cover coat layer which insulates and protects the signal wiring and the ground wiring and has a via on at least part of the ground wiring is formed. After the conductive adhesive layer surface of the electromagnetic wave shielding sheet is arranged on the cover coat layer, the electromagnetic wave shielding sheet is bonded by thermocompression, the conductive adhesive layer is allowed to flow into the via and be adhered to the ground wiring, and thereby the printed wiring board can be manufactured.

One example of the printed wiring board 7 of the disclosure is described with reference to FIG. 1.

The electromagnetic wave shielding sheet 10 includes the protection layer 3, the metal layer 2 having the plurality of openings, and the conductive adhesive layer 1.

The cover coat layer 8 is an insulating material which covers the signal wiring 6 of the wiring board and protects the signal wiring 6 from the external environment.

The cover coat layer 8 is preferably a polyimide film with a heat-curable adhesive, a heat-curable or ultraviolet-curable solder resist, or a photosensitive cover-lay film, and more preferably the photosensitive cover-lay film for micro-fabrication. In addition, the cover coat layer generally uses a well-known resin such as polyimide or the like having heat-resisting property and flexibility. The thickness of the cover coat layer 8 is usually about 10 μm-100 μm.

The circuit pattern includes the ground wiring 5 for grounding, and the signal wiring 6 for sending electric signals to the electronic component. Both the ground wiring 5 and the signal wiring 6 are usually formed by etching a copper foil. The thickness of the circuit pattern is usually about 1 μm-50 μm.

The insulation base material 9 is a support body of the circuit pattern and is preferably a bendable plastic such as polyester, polycarbonate, polyimide, polyphenylene sulfide, a liquid crystal polymer or the like, and more preferably the liquid crystal polymer and polyimide. In particular, considering the application of the printed circuit board transmitting high frequency signals, the liquid crystal polymer having a low relative dielectric constant and a low dielectric loss tangent is further preferable.

When the wiring board is a rigid wiring board, a configuration material of the insulation base material is preferably glass epoxy. The wiring board can obtain a high heat-resisting property by including these insulation base materials.

The thermal pressing of the electromagnetic wave shielding sheet 10 and the wiring board is generally carried out under conditions of a temperature of about 150° C.-190° C., a pressure of about 1 MPa-3 MPa, and a time of about 1 minute –60 minutes. By the thermal pressing, the conductive adhesive layer 1 and the cover coat layer 8 are in close contact, the conductive adhesive layer 1 flows to fill the via 11 formed in the cover coat layer 8 and thereby conductivity with the ground wiring 5 is established. By the thermal pressing, the thermosetting resin is reacted and cured.

Furthermore, in order to facilitate the curing, post-cure may also be carried out for 30 minutes-90 minutes at 150° C.-190° C. after the thermal pressing. Furthermore, the electromagnetic wave shielding sheet may be called the electromagnetic wave shielding layer after the thermal pressing.

An opening area of the via 11 is preferably 0.008 $mm^2$ or more and 0.8 $mm^2$ or less, more preferably 0.3 $mm^2$ or less, and particular preferably 0.03 $mm^2$ or less. By setting the opening area to the above range, while the ground-connection reliability is ensured and the high electromagnetic wave shielding property is maintained, a region of the ground wiring can be narrowed, and miniaturization of the printed wiring board can be achieved.

The shape of the via is not particularly limited, and any one of circle, square, rectangle, triangle, irregular shape and the like can be used depending on the application.

It is preferable that the electromagnetic wave shielding layer is formed on both surfaces of the wiring board in that leakage of the electromagnetic wave can be more effectively suppressed. The electromagnetic wave shielding sheet of the disclosure is configured by the protection layer, the metal layer, and the conductive adhesive layer, wherein the metal layer has a plurality of openings, and the aperture ratio of the openings is 0.1%-20%. In addition, in the openings of the metal layer, the average value of the circularity factor obtained by expression (2) may be 0.5 or more. Because the electromagnetic wave shielding sheet of the disclosure has the aforementioned configuration, after the electromagnetic wave shielding layer is formed on both surfaces of the wiring board, even when a reflow treatment is carried out, no foaming occurs because internal residual gas is discharged to the outside through the openings 4. In addition, the electromagnetic wave shielding sheet 10 in the printed wiring board of the disclosure can be used as a ground circuit in addition to shielding the electromagnetic waves, and thereby part of the ground circuit is omitted, and the area of the printed wiring board is reduced, by which cost reduction is possible and the printed wiring board can be incorporated in a narrow region within a housing.

In addition, the signal wiring is not particularly limited and can be used in both a single end consisting of one signal wiring and a differential circuit consisting of two signal wirings, and the differential circuit is more preferable. On the other hand, when there is a restriction on a circuit pattern area of the printed wiring board, and the ground circuits are hard to be formed in parallel, a ground circuit is not arranged beside the signal circuit, and the electromagnetic wave shielding sheet can also be used as a ground circuit to provide a printed wiring board structure having a ground in a thickness direction.

The printed wiring board of the disclosure is preferably included in (mounted to) an electronic machine such as a notebook PC, a mobile phone, a smart phone, a tablet terminal or the like in addition to a liquid crystal display, a touch panel or the like.

EXAMPLES

The disclosure is more specifically described below by examples, but the disclosure is not limited to the examples below. In addition, a term "parts" in the examples means "parts by weight" and "%" means "weight %".

Furthermore, measurement of the acid value, an weight average molecular weight (Mw) and a glass transition temperature (Tg) of the resin, the average particle diameter of the conductive filler, the circularity factor of the openings of the metal layer, and the tensile breaking strength of the electromagnetic wave shielding sheet are carried out by methods below.

<Measurement of Acid Value of Resin>

The acid value is measured in accordance with JIS K0070. Approximately 1 g of a sample is precisely weighed into a stoppered Erlenmeyer flask, and 100 ml of a tetrahydrofuran/ethanol (volume ratio: tetrahydrofuran/ethanol=2/1) mixture is added to dissolve the sample. A phenolphthalein test liquid is added as an indicator into the above solution, titration with 0.1N of alcoholic potassium hydroxide solution is carried out, and an end point is arrived when the indicator maintains pink for 30 seconds. The acid value is obtained by an expression below (unit: mgKOH/g).

$$\text{acid value(mgKOH/g)} = (5.611 \times a \times F)/S$$

Herein,

S: a collection amount (g) of the sample a: a consumption amount (ml) of the 0.1N alcoholic potassium hydroxide solution F: titer of the 0.1N alcoholic potassium hydroxide solution <Measurement of Weight Average Molecular Weight (Mw) of Resin>

In the measurement of the weight average molecular weight (Mw), GPC (gel permeation chromatography) "HPC-8020" made by TOSOH Corporation is used. GPC is a liquid chromatography which separates and quantifies a substance dissolved in a solvent (THF; tetrahydrofuran) based on a difference in molecular size of the substance. The measurement in the disclosure is carried out using two "LF-604" (Showa Denko K.K.: GPC column for rapid analysis: a size of 6 mmID×150 mm) connected in series as a column under conditions of a flow rate of 0.6 ml/min and a column temperature of 40° C., and the weight average molecular weight (Mw) is determined in terms of polystyrene.

<Glass Transition Temperature (Tg) of Resin>

The measurement of Tg is carried out by differential scanning calorimetry ("DSC-1" made by Mettler Toledo International Inc.).

<Measure of Average Particle Diameter of Conductive Filler>

The $D_{50}$ average particle diameter is a value which is obtained by measuring a conductive filler using a laser diffraction-scattering particle size distribution measurement device LS13320 (Beckman Coulter, Inc.) by a tornado dry powder sample module, and is the particle diameter when a cumulative value in a particle size cumulative distribution is 50%. Furthermore, a refractive index is set to 1.6.

<Measurement of Circularity Factor of Openings>

A plane image of the metal layer is obtained at a magnification of 2000 times-5000 times using a reflection electron microscope JSM-IT100 (Japan Electron Optics Laboratory Corporation) in a manner that about 20 openings of the metal layer are contained, and the plane image is analyzed by the above method.

<Measurement of tensile breaking Strength>

Two pieces of the electromagnetic wave shielding sheets are prepared, release films on the conductive adhesive layer side of the respective electromagnetic wave shielding sheets are peeled, and conductive adhesive layer surfaces of each other are bonded by a hot roll laminator to obtain a lamination body. After the lamination body is cut into a size of a width 20 mm×a length 60 mm, the peelable film on the protection layer side is peeled off on both sides to obtain a measurement sample. With regard to the measurement sample, a tensile test (test speed 50 mm/min) is conducted under conditions of a temperature of 25° C. and a relative humidity of 50% using a small-sized desktop tester EZ-TEST (manufactured by Shimadzu Corporation). The tensile breaking strength of the electromagnetic wave shielding sheet (N/20 mm) is calculated from a S-S curve (Stress-Strain curve) that is obtained.

Next, raw materials used in the examples are shown below.

(Raw Materials)

Conductive filler: composite fine particles (dendrite-like fine particles coated with 10 parts by weight of silver with respect to 100 parts by weight of copper of the core), average particle diameter $D_{50}$: 11.0 μM, manufactured by Fukuda metal foil and powder Corporation Thermosetting resin: a polyurethane urea resin with an acid value of 5 mgKOH/g, a weight average molecular weight of 54,000, and a Tg of −7° C. (manufactured by Toyochem Corporation)

Epoxy compound: "JER828" (Bisphenol A type epoxy resin, epoxy equivalent=189 g/eq) manufactured by Mitsubishi Chemical Corporation Aziridine compound: "Chemitite PZ-33" manufactured by Nippon Shokubai Co., Ltd.

<Manufacturing of Conductive Resin Composition 1>

In terms of solid content, 100 parts of the thermosetting resin, 52 parts of the conductive filler, 10 parts of the epoxy compound, and 0.5 part of the aziridine compound are fed into a container, a mixed solvent (toluene:isopropyl alcohol=2:1 (weight ratio)) is added so that non-volatile content concentration is 40%, and the mixture is stirred for 10 minutes with a disperser to obtain the conductive resin composition.

The conductive resin composition is coated onto the peelable sheet by a bar coater so that the dry thickness is 10 μm and the conductive resin composition is dried in an electric oven at 100° C. for 2 minutes, and thereby the conductive resin composition (the conductive adhesive layer) 1 is obtained.

<Manufacturing of Conductive Resin Compositions 2-15>

Conductive resin compositions (conductive adhesive layers) 2-15 shown in table 1 and table 2 are manufactured by the same method as the conductive resin composition 1 except that an additive amount of the conductive filler and an additive amount of the epoxy compound are changed.

TABLE 1

|  | Conductive resin composition 1 | Conductive resin composition 2 | Conductive resin composition 3 | Conductive resin composition 4 | Conductive resin composition 5 |
|---|---|---|---|---|---|
| Thermosetting resin | 100 | 100 | 100 | 100 | 100 |
| Epoxy compound | 10 | 10 | 10 | 10 | 10 |
| Aziridine compound | 0.5 | 0.5 | 0.5 | 0.5 | 0.5 |
| Conductive filler | 52 | 59.63 | 71 | 74 | 166 |
| Conductive filler content [mass %] | 32% | 35% | 39% | 40% | 60% |

|  | Conductive resin composition 6 | Conductive resin composition 7 | Conductive resin composition 8 | Conductive resin composition 9 | Conductive resin composition 10 |
|---|---|---|---|---|---|
| Thermosetting resin | 100 | 100 | 100 | 100 | 100 |
| Epoxy compound | 10 | 10 | 10 | 10 | 10 |
| Aziridine compound | 0.5 | 0.5 | 0.5 | 0.5 | 0.5 |
| Conductive filler | 205 | 257 | 331 | 993 | 1259 |
| Conductive filler content [mass %] | 65% | 70% | 75% | 90% | 92% |

TABLE 2

|  | Conductive resin composition 11 | Conductive resin composition 12 | Conductive resin composition 13 | Conductive resin composition 14 | Conductive resin composition 15 |
|---|---|---|---|---|---|
| Thermosetting resin | 100 | 100 | 100 | 100 | 100 |
| Epoxy compound | 6.5 | 8.5 | 29.5 | 39.5 | 49.5 |
| Aziridine compound | 0.5 | 0.5 | 0.5 | 0.5 | 0.5 |
| Conductive filler | 72 | 73 | 87 | 94 | 100 |
| Conductive filler content [mass %] | 40% | 40% | 40% | 40% | 40% |

Example 1

In terms of solid content, 100 parts of the thermosetting resin, 10 parts of the epoxy compound and 1 part of the aziridine compound are added, and the mixture is stirred for 10 minutes with a disperser to obtain the resin composition. After the resultant resin composition is coated on the copper foil 1 using a bar coater so that the dry thickness is 5 μm and dried in an electric oven at 100° C. for 2 minutes, a slightly tacky peelable sheet is bonded to the protection layer.

Next, the copper carrier of the copper foil is peeled, and the conductive adhesive layer is bonded to the copper foil surface, and thereby the electromagnetic wave shielding sheet including "the peelable sheet/the protection layer/the copper foil/the conductive adhesive layer/the peelable sheet" is obtained. The copper foil 1 and the conductive adhesive layer are boned by a heat laminator at a temperature of 90° C. and a pressure of 3 kgf/cm².

Furthermore, the copper foil is a copper foil having a circularity factor of opening, an aperture ratio and the like shown in table 3. The openings of the copper foil are formed by forming a pattern resist layer on the copper foil formed on the copper carrier via a peel layer and etching the copper foil.

Examples 2-33, Comparison Examples 1-3

Electromagnetic wave shielding sheets of the examples 2-33 and comparison example 1-3 are obtained respectively in the same way as the example 1 except that the conductive adhesive layer and a type of the copper foil in the example 1 are changed.

Furthermore, the copper foils of the examples and the comparison examples are obtained in the same way as the example 1 by a method in which the pattern resist layer is formed on the copper foil formed on the peel layer via the copper carrier, and the openings are formed by etching. Circularity factors and aperture ratios of the openings of the copper foils and the like in the examples and the comparison examples are shown in table 3-table 6.

Evaluations below are carried out using the resultant electromagnetic wave shielding sheet. Results are shown in table 3-table 6.

<Solder Reflow Resistance>

The solder reflow resistance is evaluated according to whether or not an appearance changes after the electromagnetic wave shielding sheet and a molten solder are brought into contact. The appearance of an electromagnetic wave shielding sheet with a high solder reflow resistance does not change, while foaming or peeling occurs in an electromagnetic wave shielding sheet with a low solder reflow resistance.

First, a peelable sheet of a conductive adhesive layer of an electromagnetic wave shielding sheet with a width of 25 mm and a length of 70 mm is peeled, and the exposed conductive adhesive layer and a gold-plated surface of a gold-plated copper clad lamination board (gold plating 0.3 μm/nickel plating 1 μm/copper foil 18 μm/adhesive 20 μm/polyimide film 25 μm) with a total thickness of 64 μm are pressed under conditions of 150° C., 2.0 MPa, and 30 minutes and thermally cured to obtain a lamination body. The resultant lamination body is cut into a size of a width of 10 mm and a length of 65 mm to manufacture a sample. The resultant sample is left for 72 hours in an atmosphere of 40° C. and 90% RH. Thereafter, the sample is floated on the molten solder with the polyimide film surface down at 250° C. for 1 minutes, next the sample is taken out, an appearance thereof is visually observed, and whether or not there is an abnormality such as foaming, floating, peeling or the like is evaluated based on criteria below.

◎: No change in appearance.
○: Few small bubbles are observed.
Δ: Many small bubbles are observed.
ΔΔ: Small bubbles are observed on the entire surface of the sample.
x: Severe foaming or peeling is observed.

<Electromagnetic Wave Shielding Property>

The electromagnetic wave shielding property is evaluated by measuring the crosstalk. The crosstalk is evaluated using samples for measurement below.

(Manufacturing of Wiring Board Having Coplanar Circuit)

Figure 2:
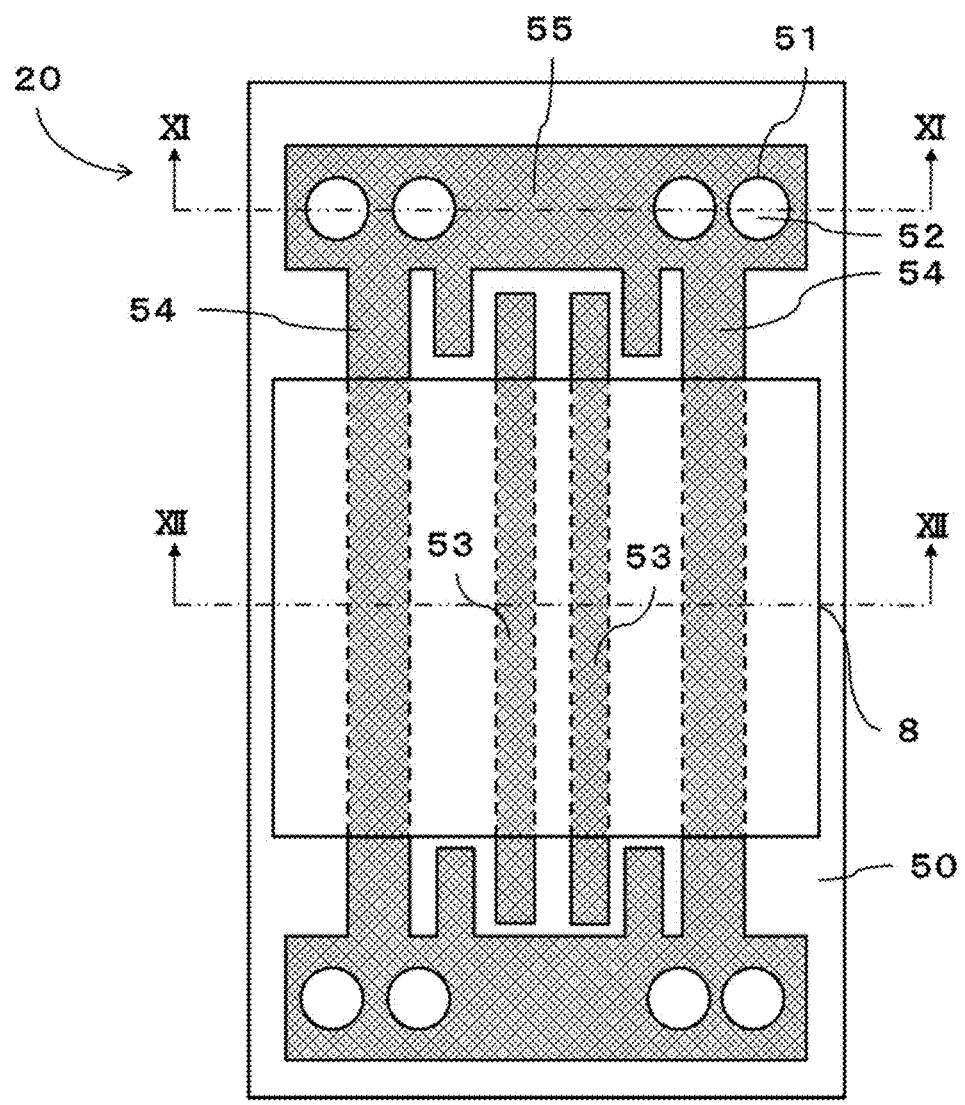
FIG. 2 is a schematic plan view of a principal surface side of a printed wiring board according to an example and a comparison example.
Figure 3:
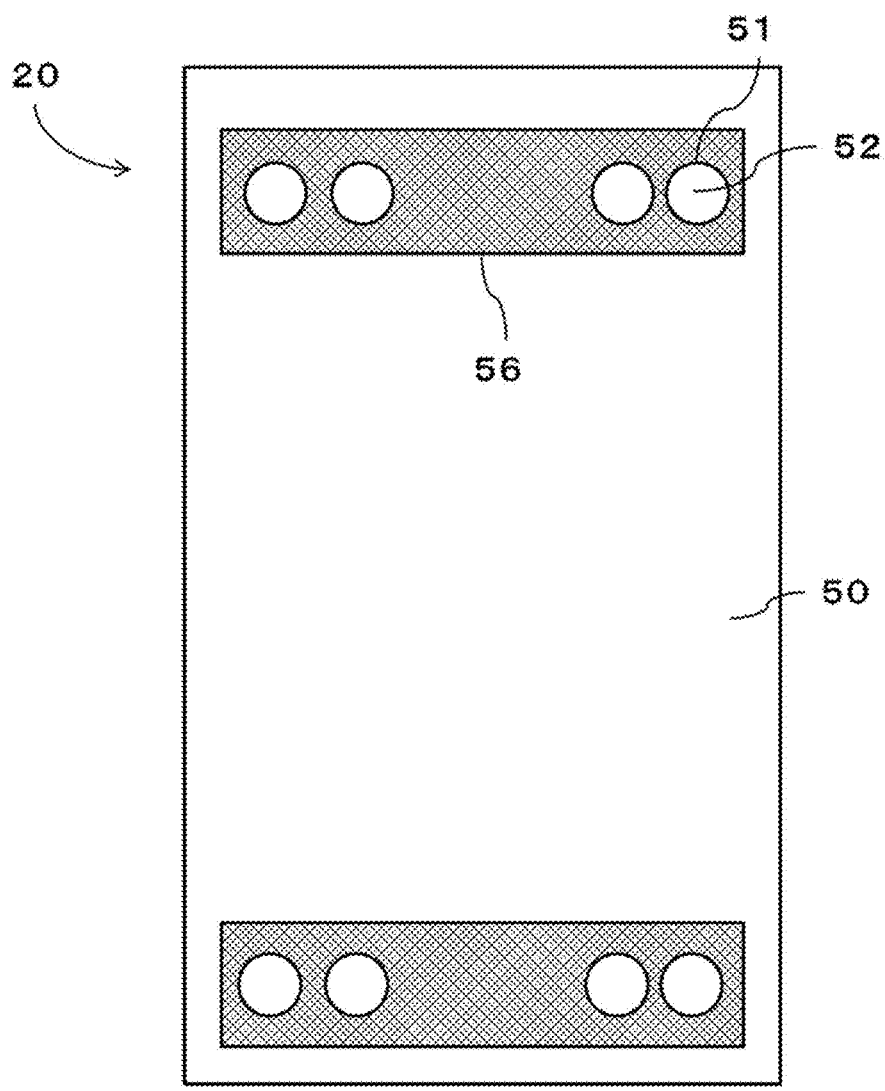
FIG. 3 is a schematic plan view of a back surface side of the printed wiring board according to the example and the comparison example.

FIG. 2 is a schematic plan view of a principal surface side of the flexible printed wiring board having coplanar circuit (hereinafter, also referred to as the wiring board having coplanar circuit) 20 used in the measurement, and FIG. 3 is a schematic plan view of a back surface side. First, a double-surface CCL "R-F775" (manufactured by Panasonic Corporation) in which a rolled copper foil with a thickness of 12 μm is laminated on both surfaces of the polyimide film 50 with a thickness of 50 μm is prepared. Then, six through holes 51 (diameter 0.1 mm) are respectively arranged in the vicinity of four rectangular corners. Furthermore, in the diagram, for convenience of illustration, only two through holes 51 are shown at each corner. Next, after an electro-less plating treatment is carried out, an electrolytic plating treatment is carried out to form a copper plating film 52 of 10 μm, and conduction between both principal surfaces is ensured via the through holes 51. Thereafter, as shown in FIG. 2, on the principal surface of the polyimide film 50, the ground pattern (i) 55 is formed in a region including two signal wirings 53 with a length of 10 cm, ground wirings 54 parallel to the signal wirings 53 outside the signal wirings 53, and the through holes 51 in the short direction of the polyimide film 50 and extended from the ground wirings 54.

Thereafter, the copper foil formed on the back surface of the polyimide film 50 is etched, and a back surface side ground pattern (ii) 56 shown in FIG. 3 is obtained in a place corresponding to the ground pattern (i) 55. Check specifications of the appearances of the circuit and tolerance are in accordance with the JPCA standard (JPCA-DG02). Next, a cover coat layer 8 "CISV1215 (manufactured by NIKKAN Industries Co., Ltd.)" configured by a polyimide film 8a (thickness 12.5 µm) and a conductive adhesive layer 8b (thickness 15 µm) is attached to the principal surface side of the polyimide film 50 (see FIG. 2). Furthermore, in FIG. 2, the cover coat layer 8 is shown in a perspective view so that a structure of the signal wirings 53 and the like can be understood. Thereafter, the copper foil pattern exposed from the cover coat layer 8 is nickel-plated (not shown) and then gold-plating (not shown) treatment is carried out.

Figure 4:
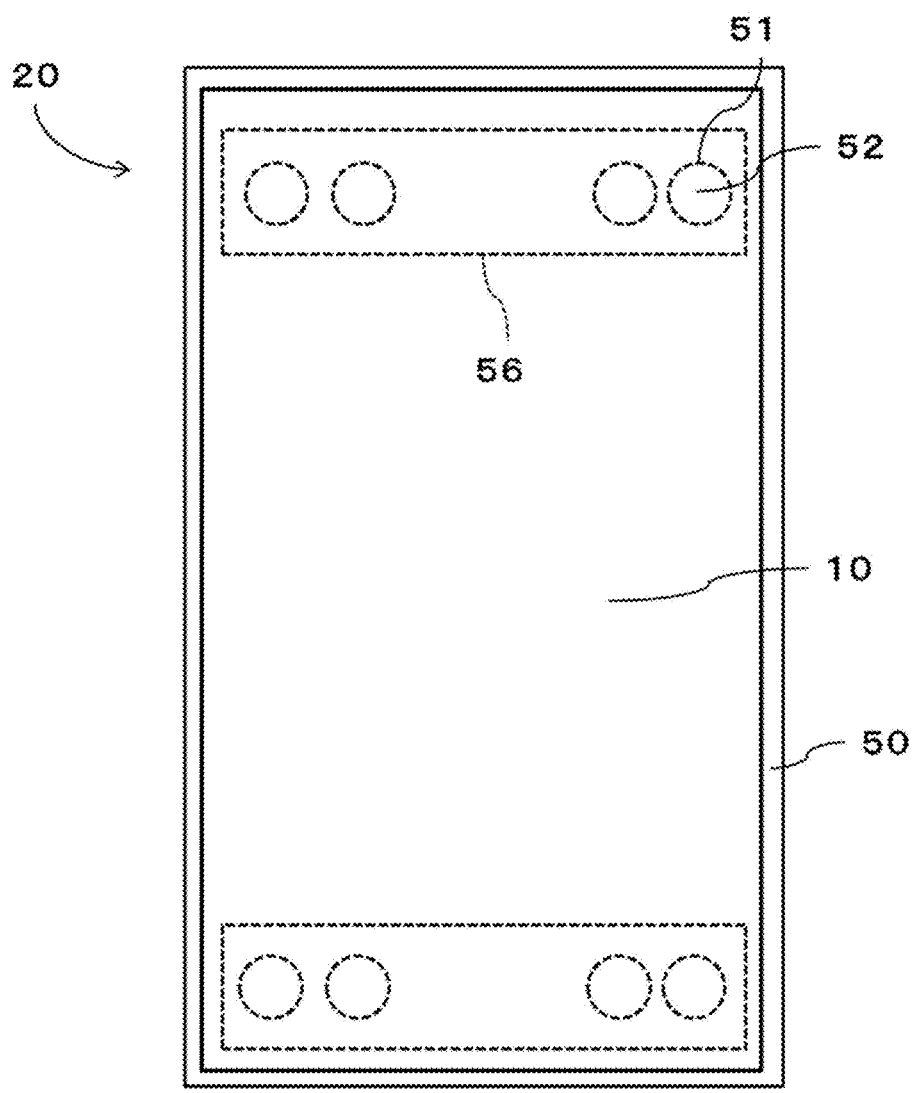
FIG. 4 is a schematic plan view of a back surface side of the printed wiring board according to the example and the comparison example.

Next, as shown in FIG. 4, the electromagnetic wave shielding sheet 10 including the lamination body of the conductive adhesive layer 1, the metal layer 2, and the protection layer 3 is prepared, and the peelable sheet (not shown) arranged on the conductive adhesive layer 1 of the electromagnetic wave shielding sheet 10 is peeled. Then, the conductive adhesive layer 1 of the electromagnetic wave shielding sheet 10 is taken as an inner side and pressed on an entire back surface side of the wiring board 20 having the coplanar circuit under conditions of 150° C., 2.0 MPa, and 30 minutes, and thereby the wiring board 20 having the coplanar circuit with the electromagnetic wave shielding sheet is obtained. In FIG. 4, the back surface side ground pattern (ii) 56 is shown in a perspective view.

(Manufacturing of Wiring Board Having Microstrip Line Circuit)

Figure 5:
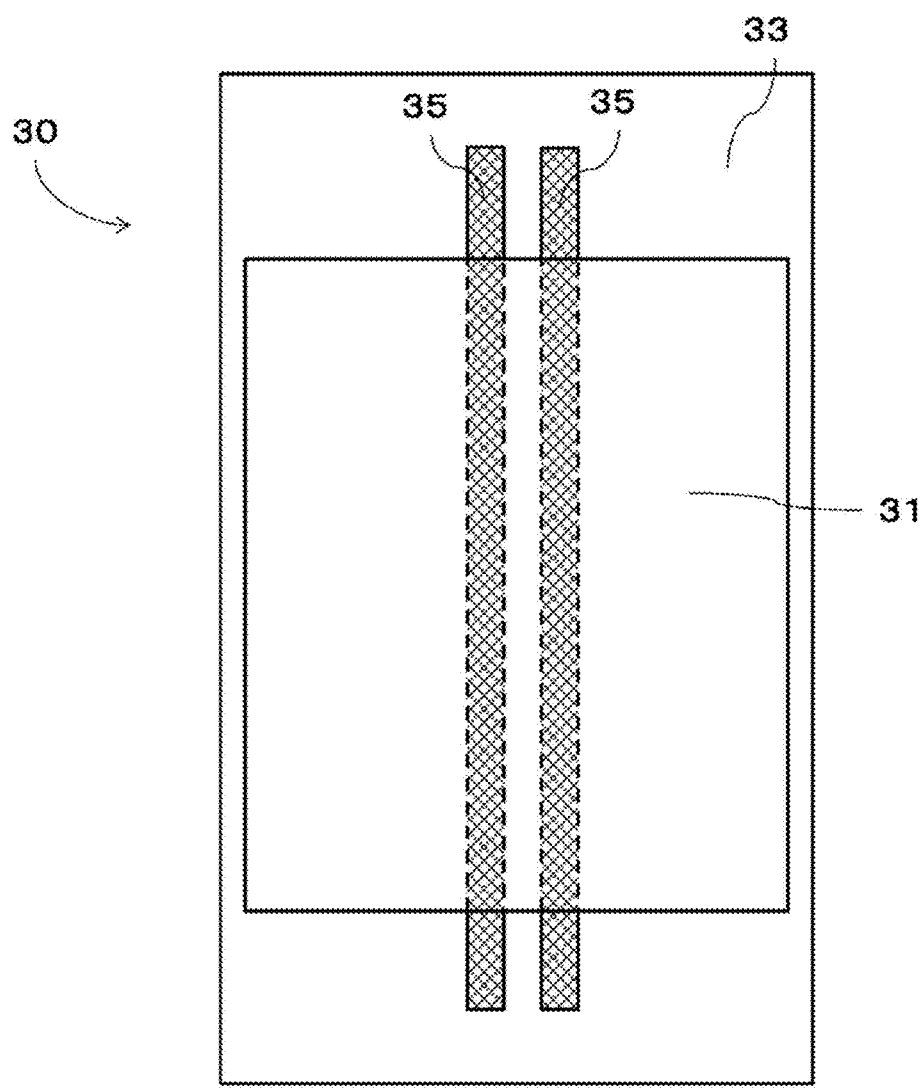
FIG. 5 is a schematic plan view of a principal surface side of a printed wiring board having a microstrip line circuit for crosstalk measurement.
Figure 6:
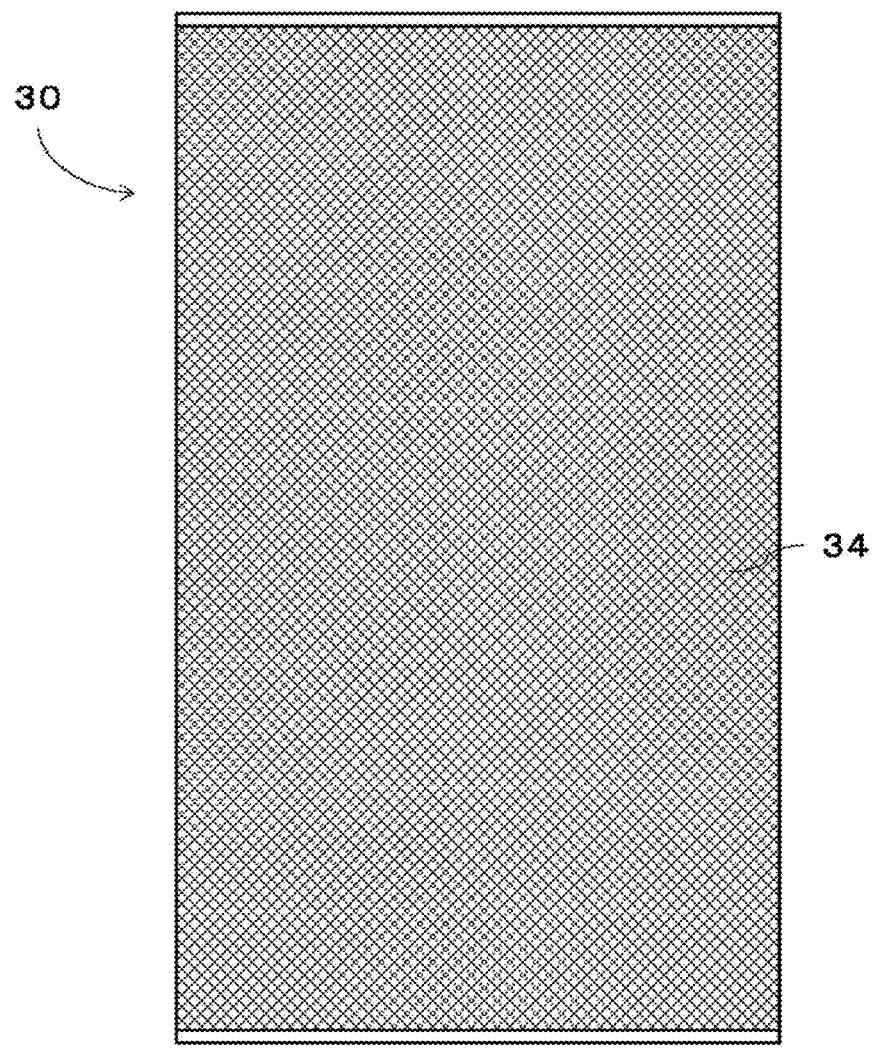
FIG. 6 is a schematic plan view of a back surface side of the printed wiring board having a microstrip line circuit for crosstalk measurement.

A wiring board 30 having microstrip line circuit is manufactured separately as shown in FIG. 5 and FIG. 6. First, the double-surface CCL "R-F775" (manufactured by Panasonic Corporation) in which the rolled copper foil with a thickness of 12 µm is laminated is prepared. Then, two signal wirings 35 with a length of 10 cm are formed on one surface by etching. Check specifications of the appearance of the circuit and tolerance are in accordance with the JPCA standard (JPCA-DG02). Next, a cover-lay 31 "CISV1215 (manufactured by NIKKAN Industries Co., Ltd.)" configured by a polyimide film 31a (thickness 12.5 µm) and a conductive adhesive layer 31b (thickness 15 µm) is attached to the signal wirings 35 side (see FIG. 5). Furthermore, in FIG. 5, the cover-lay 31 is shown in a perspective view so that a structure of the signal wirings 53 and the like can be understood. Thereafter, the signal wirings 35 exposed from the cover-lay 31 are nickel-plated (not shown) and then gold-plating (not shown) treatment is carried out. In addition, as shown in FIG. 6, a grounding layer 34 is arranged on a back surface side of the polyimide film 33.

(Manufacturing of Test Piece)

Figure 7:
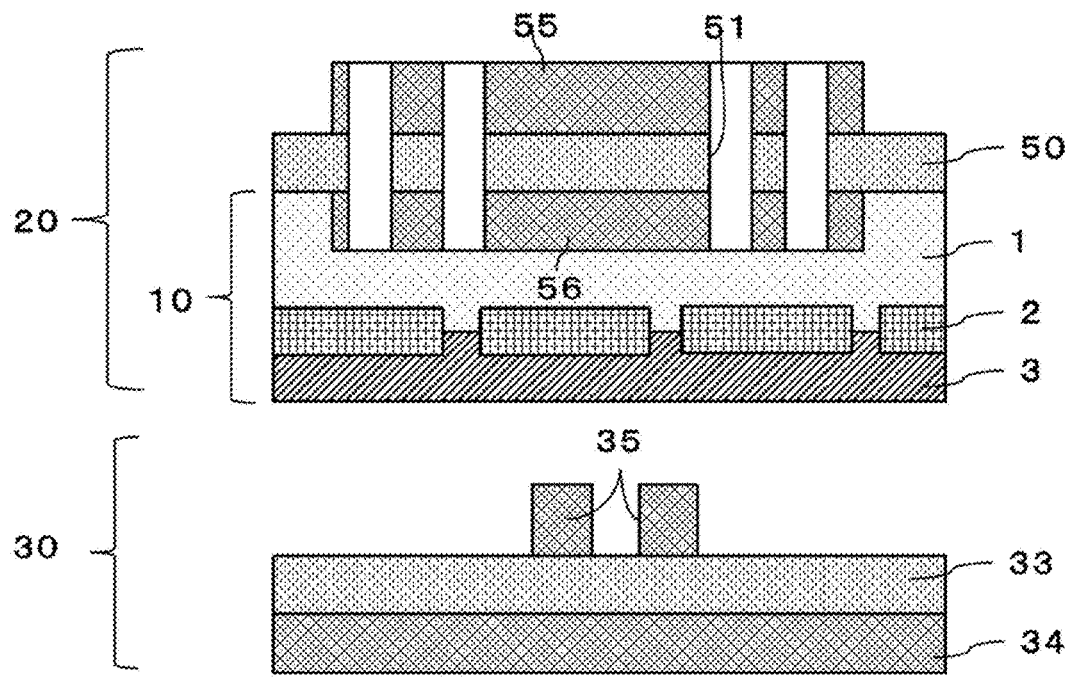
FIG. 7 is a cross-section view of a cutoff portion along XI-XI of FIG. 2.
Figure 8:
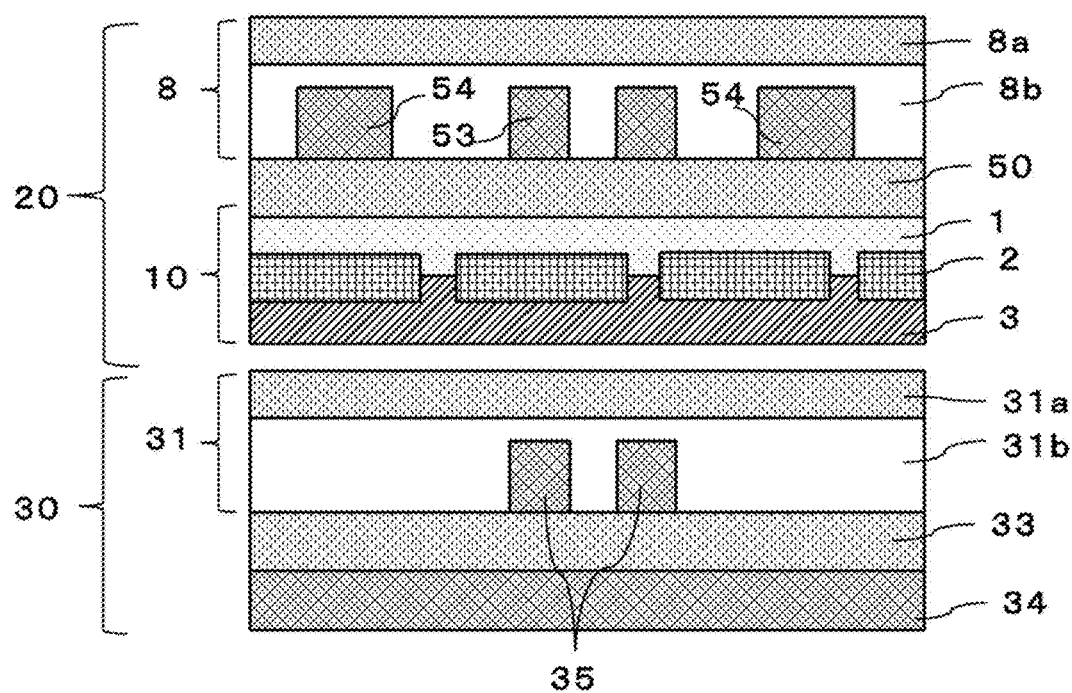
FIG. 8 is a cross-section view of a cutoff portion along XII-XII of FIG. 2.

Next, the signal wiring 35 side of the wiring board 30 having the microstrip line circuit and the electromagnetic wave shielding sheet 10 side of the wiring board 20 having the coplanar circuit are laminated to be in contact and are fixed by a fixture. A schematic cross-section view of the lamination body is shown in FIG. 7 and FIG. 8. FIG. 7 is equivalent to a cross-section view of a cutoff portion along XI-XI of FIG. 2, and FIG. 8 is equivalent to a cross-section view of a cutoff portion along XII-XII of FIG. 2.

A network analyzer E5071C (manufactured by Agilent Japan Ltd.) is connected to the exposed signal wirings 35 of the wiring board 30 having the microstrip line circuit and the exposed signal wirings 53 of the wiring board 20 having the coplanar circuit. Then, sine waves of 10 MHz-20 GHz are input to the signal wirings 35 of the wiring board 30 having the microstrip line circuit, the crosstalk in the wiring board 20 having the coplanar circuit at this time is measured, and an influence of the electromagnetic wave shielding property is confirmed according to the value of the crosstalk.

Furthermore, L/S (line/space) of the signal wiring 35 is appropriately adjusted so that a characteristic impedance is within ±10Ω. A width of the ground wiring 54 is set to 100 µm, and a distance between the ground wiring 54 and the signal wiring 53 is set to 1 mm.

The measured crosstalk is evaluated based on criteria below. Evaluate results (electromagnetic wave shielding properties) are shown in table 3-table 6.

⊚: Crosstalk in 10 GHz is less than −55 dB
○: Crosstalk in 10 GHz is −55 dB or more and less than −50 dB
Δ: Crosstalk in 10 GHz is −50 dB or more and less than −45 dB
x: Crosstalk in 10 GHz is −45 dB or more <Electromagnetic Wave Shielding Property Over Time Under High Temperature and High Humidity>

After the wiring board 20 having the coplanar circuit with the with electromagnetic wave shielding sheet is left for 500 hours under a high temperature and high humidity environment of 85° C. and 85%, the crosstalk in 10 GHz is measured. Furthermore, the measurement of the crosstalk in 10 GHz is the same as the measurement of the electromagnetic wave shielding property except that the wiring board 20 is left under the high temperature and high humidity environment for 500 hours.

⊚: Crosstalk in 10 GHz is less than −55 dB
○: Crosstalk in 10 GHz is −55 dB or more and less than −50 dB
Δ: Crosstalk in 10 GHz is −50 dB or more and less than −45 dB
x: Crosstalk in 10 GHz is −45 dB or more <Crack Resistance>

An electromagnetic wave shielding sheet with a width of 50 mm and a length of 50 mm is thermally pressed under conditions of 150° C., 5.0 MPa, and 30 minutes without peeling the peelable sheet of the conductive adhesive layer. Thereafter, the peelable sheet is peeled, and whether or not there is a crack in the metal layer is confirmed from a conductive adhesive side by an optical microscope. Evaluation criteria are as follows.

⊚: No crack, an extremely good result.
○: 1-5 crack places, a good result.
Δ: 6-10 crack places, no problem in practical use.
x: 11 or more crack places, unavailable in practical use.

<Connection Reliability to Small Opening Via>

As shown in FIGS. 9(1)-9(3), on a polyimide film 21 with a thickness of 25 µm, a copper foil circuit 22A and a copper foil circuit 22B with a thickness of 18 µm which are not electrically connected to each other are formed. Next, a polyimide cover-lay with adhesive 23 which has a circular via 24 with a thickness of 37.5 µm and a diameter of 1.1 mm (a via area is 1.0 mm$^2$) is laminated on the copper foil circuit 22A to form a flexible printed wiring board.

In addition, an electromagnetic wave shielding sheet 25 with a size of a width of 20 mm and a length of 50 mm is prepared. Then, as shown in FIGS. 9(4)-9(6), a peelable sheet is peeled from the electromagnetic wave shielding sheet 25, an exposed conductive adhesive layer 25b is pressed on the flexible printed wiring board formed as described above under conditions of 150° C., 2 MPa, and 30 minutes, and the conductive adhesive layer 25b and a protection layer 25a of the electromagnetic wave shielding sheet are cured.

Next, the peelable sheet on the protection layer 25a side of the sample is removed, and an initial connection resistance value between 22A-22B shown in the plan view of FIG. 9(4) is measured using a BSP probe of "Loresta GP"

manufactured by Mitsubishi Chemical Corporation. Furthermore, FIG. 9(2) is a cross-section view along D-D' in FIG. 9(1), and FIG. 9(3) is a cross-section view along C-C' in FIG. 9(1). Similarly, FIG. 9(5) is a cross-section view along D-D' in FIG. 9(4), and FIG. 9(6) is a cross-section view along C-C' in FIG. 9(4). A via diameter is made with a scale of 0.1 mm from 1.1 mm (the via area is 1.0 mm$^2$) to 0.1 mm (the via area is 0.008 mm$^2$), connection reliability tests are carried out respectively in the same way as described above, and a smallest via diameter under which the connection resistance value is 200 mΩ, or less is confirmed.

⊚: The smallest via diameter is 0.2 mm (the via area is 0.03 mm$^2$) or less, an extremely good result.

○: The smallest via diameter is 0.3 mm (the via area is 0.07 mm$^2$) or more and 0.6 mm (the via area is 0.3 mm$^2$) or less, a good result.

Δ: The smallest via diameter is 0.7 mm (the via area is 0.4 mm$^2$) or more and 1.0 mm (the via area is 0.8 mm$^2$) or less, no problem in practical use.

x: The smallest via diameter is 1.1 mm (the via area is 1.0 mm$^2$) or the connection resistance value does not reach 200 mΩ, or lower, unavailable in practical use.

TABLE 3

|  |  | Example 1 | Example 2 | Example 3 | Example 4 | Example 5 | Example 6 |
|---|---|---|---|---|---|---|---|
| Protection layer |  | Resin composition 1 | Resin composition 1 | Resin composition 1 | Resin composition 1 | Resin composition 1 | Resin composition 1 |
| Metal layer | Type of metal layer | Copper foil 1 | Copper foil 2 | Copper foil 3 | Copper foil 4 | Copper foil 5 | Copper foil 6 |
|  | Diameter of openings [μm] | 20 | 20 | 20 | 20 | 20 | 20 |
|  | Opening area [μm$^2$] | 314 | 314 | 314 | 314 | 314 | 314 |
|  | Number of openings [per cm$^2$] | 350 | 600 | 1000 | 1500 | 3200 | 20000 |
|  | Aperture ratio [%] | 0.1% | 0.2% | 0.3% | 0.5% | 1.0% | 6.3% |
|  | Circularity factor of openings | 0.7 | 0.7 | 0.7 | 0.7 | 0.7 | 0.7 |
|  | Thickness [μm] | 3 | 3 | 3 | 3 | 3 | 3 |
| Conductive adhesive layer |  | Conductive resin composition 4 | Conductive resin composition 4 | Conductive resin composition 4 | Conductive resin composition 4 | Conductive resin composition 4 | Conductive resin composition 4 |
| Tensile breaking strength of electromagnetic wave shielding sheet |  | 80 | 60 | 55 | 53 | 50 | 45 |
| Solder reflow resistance |  | Δ | ○ | ⊚ | ⊚ | ⊚ | ⊚ |
| Electromagnetic wave shielding property |  | ⊚ | ⊚ | ⊚ | ⊚ | ⊚ | ⊚ |
| Electromagnetic wave shielding property over time under high temperature and high humidity |  | ⊚ | ⊚ | ⊚ | ⊚ | ⊚ | ⊚ |
| Crack resistance |  | ⊚ | ⊚ | ⊚ | ⊚ | ⊚ | ⊚ |
| Connection reliability of small opening via |  | ⊚ | ⊚ | ⊚ | ⊚ | ⊚ | ⊚ |

|  |  | Example 7 | Example 8 | Example 9 | Example 10 | Example 11 |
|---|---|---|---|---|---|---|
| Protection layer |  | Resin composition 1 | Resin composition 1 | Resin composition 1 | Resin composition 1 | Resin composition 1 |
| Metal layer | Type of metal layer | Copper foil 7 | Copper foil 8 | Copper foil 9 | Copper foil 10 | Copper foil 11 |
|  | Diameter of openings [μm] | 20 | 20 | 20 | 20 | 20 |

TABLE 3-continued

|  |  |  |  |  |  |  |
|---|---|---|---|---|---|---|
|  | Opening area [μm²] | 314 | 314 | 314 | 314 | 314 |
|  | Number of openings [per cm²] | 30000 | 35000 | 45000 | 50000 | 62000 |
|  | Aperture ratio [%] | 9.4% | 11.0% | 14.1% | 15.7% | 19.5% |
|  | Circularity factor of openings | 0.7 | 0.7 | 0.7 | 0.7 | 0.7 |
|  | Thickness [μm] | 3 | 3 | 3 | 3 | 3 |
| Conductive adhesive layer |  | Conductive resin composition 4 | Conductive resin composition 4 | Conductive resin composition 4 | Conductive resin composition 4 | Conductive resin composition 4 |
| Tensile breaking strength of electromagnetic wave shielding sheet |  | 40 | 38 | 35 | 31 | 28 |
| Solder reflow resistance |  | ◎ | ◎ | ◎ | ◎ | ◎ |
| Electromagnetic wave shielding property |  | ◎ | ○ | ○ | Δ | Δ |
| Electromagnetic wave shielding property over time under high temperature and high humidity |  | ○ | ○ | ○ | Δ | Δ |
| Crack resistance |  | ◎ | ◎ | ◎ | ◎ | ○ |
| Connection reliability of small opening via |  | ◎ | ◎ | ◎ | ◎ | ◎ |

TABLE 4

|  |  | Example 12 | Example 13 | Example 14 | Example 15 | Example 16 | Example 17 | Example 18 | Example 19 |
|---|---|---|---|---|---|---|---|---|---|
| Protection layer |  | Resin composition 1 | Resin composition 1 | Resin composition 1 | Resin composition 1 | Resin composition 1 | Resin composition 1 | Resin composition 1 | Resin composition 1 |
| Metal layer | Type of metal layer | Copper foil 12 | Copper foil 13 | Copper foil 14 | Copper foil 15 | Copper foil 16 | Copper foil 17 | Copper foil 18 | Copper foil 19 |
|  | Diameter of opening [μm] | 20 | 20 | 20 | 20 | 20 | 20 | 20 | 20 |
|  | Opening area [μm²] | 314 | 314 | 314 | 314 | 314 | 314 | 314 | 314 |
|  | Number of openings [per cm²] | 3200 | 3200 | 3200 | 3200 | 3200 | 3200 | 3200 | 3200 |
|  | Aperture ratio [%] | 1.0% | 1.0% | 1.0% | 1.0% | 1.0% | 1.0% | 1.0% | 1.0% |
|  | Circularity factor of openings | 0.5 | 0.6 | 0.7 | 0.7 | 0.7 | 0.7 | 0.7 | 0.7 |
|  | Thickness [μm] | 3 | 3 | 0.5 | 1 | 4 | 4.5 | 5 | 5.5 |

TABLE 4-continued

|  | Example 12 | Example 13 | Example 14 | Example 15 | Example 16 | Example 17 | Example 18 | Example 19 |
| --- | --- | --- | --- | --- | --- | --- | --- | --- |
| Conductive adhesive layer | Conductive resin composition 4 | Conductive resin composition 4 | Conductive resin composition 4 | Conductive resin composition 4 | Conductive resin composition 4 | Conductive resin composition 4 | Conductive resin composition 4 | Conductive resin composition 4 |
| Tensile breaking strength of electromagnetic wave shielding sheet | 20 | 30 | 13 | 30 | 57 | 68 | 79 | 80 |
| Solder reflow resistance | ◎ | ◎ | ◎ | ◎ | ◎ | ◎ | ◎ | ◎ |
| Electromagnetic wave shielding property | ◎ | ◎ | ○ | ◎ | ◎ | ◎ | ◎ | ◎ |
| Electromagnetic wave shielding property over time under high temperature and high humidity | Δ | ○ | ◎ | ◎ | ◎ | ◎ | ◎ | ◎ |
| Crack resistance | ○ | ◎ | ◎ | ◎ | ◎ | ◎ | ○ | Δ |
| Connection reliability of small opening via | ◎ | ◎ | ◎ | ◎ | ◎ | ◎ | ◎ | ◎ |

TABLE 5

|  |  | Example 20 | Example 21 | Example 22 | Example 23 | Example 24 | Example 25 | Example 26 | Example 27 | Example 28 |
| --- | --- | --- | --- | --- | --- | --- | --- | --- | --- | --- |
| Protection layer |  | Resin composition 1 | Resin composition 1 | Resin composition 1 | Resin composition 1 | Resin composition 1 | Resin composition 1 | Resin composition 1 | Resin composition 1 | Resin composition 1 |
| Metal layer | Type of metal layer | Copper foil 6 | Copper foil 6 | Copper foil 6 | Copper foil 6 | Copper foil 6 | Copper foil 6 | Copper foil 6 | Copper foil 6 | Copper foil 6 |
|  | Diameter of openings [μm] | 20 | 20 | 20 | 20 | 20 | 20 | 20 | 20 | 20 |
|  | Opening area [μm$^2$] | 314 | 314 | 314 | 314 | 314 | 314 | 314 | 314 | 314 |
|  | Number of openings [per cm$^2$] | 3200 | 3200 | 3200 | 3200 | 3200 | 3200 | 3200 | 3200 | 3200 |
|  | Aperture ratio [%] | 1.0% | 1.0% | 1.0% | 1.0% | 1.0% | 1.0% | 1.0% | 1.0% | 1.0% |
|  | Circularity factor of openings | 0.7 | 0.7 | 0.7 | 0.7 | 0.7 | 0.7 | 0.7 | 0.7 | 0.7 |
|  | Thickness [μm] | 3 | 3 | 3 | 3 | 3 | 3 | 3 | 3 | 3 |
| Conductive adhesive layer |  | Conductive resin composition 1 | Conductive resin composition 2 | Conductive resin composition 3 | Conductive resin composition 5 | Conductive resin composition 6 | Conductive resin composition 7 | Conductive resin composition 8 | Conductive resin composition 9 | Conductive resin composition 10 |
| Tensile breaking strength of electromagnetic wave shielding sheet |  | 50 | 50 | 50 | 50 | 50 | 50 | 50 | 50 | 50 |
| Solder reflow resistance |  | ◎ | ◎ | ◎ | ◎ | ◎ | ○ | Δ | Δ | ΔΔ |
| Electromagnetic wave shielding property |  | ◎ | ◎ | ◎ | ◎ | ◎ | ◎ | ◎ | ◎ | ◎ |
| Electromagnetic wave shielding property over time under high |  | ◎ | ◎ | ◎ | ◎ | ◎ | ◎ | ◎ | ◎ | ◎ |

TABLE 5-continued

|  | Example 20 | Example 21 | Example 22 | Example 23 | Example 24 | Example 25 | Example 26 | Example 27 | Example 28 |
|---|---|---|---|---|---|---|---|---|---|
| temperature and high humidity |  |  |  |  |  |  |  |  |  |
| Crack resistance | ◎ | ◎ | ◎ | ◎ | ◎ | ◎ | ◎ | ◎ | ◎ |
| Connection reliability of small opening via | Δ | ○ | ○ | ◎ | ◎ | ◎ | ◎ | ◎ | ◎ |

TABLE 6

|  |  | Example 29 | Example 30 | Example 31 | Example 32 | Example 33 | Comparison example 1 | Comparison example 2 | Comparison example 3 |
|---|---|---|---|---|---|---|---|---|---|
| Protection layer |  | Resin composition 1 | Resin composition 1 | Resin composition 1 | Resin composition 1 | Resin composition 1 | Resin composition 1 | Resin composition 1 | Resin composition 1 |
| Metal layer | Type of metal layer | Copper foil 6 | Copper foil 6 | Copper foil 6 | Copper foil 6 | Copper foil 6 | Copper foil 20 | Copper foil 21 | Copper foil 22 |
|  | Diameter of openings [μm] | 20 | 20 | 20 | 20 | 20 | 20 | 20 | 20 |
|  | Opening area [μm²] | 314 | 314 | 314 | 314 | 314 | 314 | 314 | 314 |
|  | Number of openings [per cm²] | 3200 | 3200 | 3200 | 3200 | 3200 | 90 | 68000 | 3200 |
|  | Aperture ratio [%] | 1.0% | 1.0% | 1.0% | 1.0% | 1.0% | 0.03% | 21.4% | 1.0% |
|  | Circularity factor of openings | 0.7 | 0.7 | 0.7 | 0.7 | 0.7 | 0.7 | 0.7 | 0.7 |
|  | Thickness [μm] | 3 | 3 | 3 | 3 | 3 | 3 | 3 | 0.1 |
| Conductive adhesive layer |  | Conductive resin composition 11 | Conductive resin composition 12 | Conductive resin composition 13 | Conductive resin composition 14 | Conductive resin composition 15 | Conductive resin composition 4 | Conductive resin composition 4 | Conductive resin composition 4 |
| Tensile breaking strength of electromagnetic wave shielding sheet |  | 13 | 26 | 60 | 68 | 76 | 90 | 19 | 5 |
| Solder reflow resistance |  | ◎ | ◎ | ◎ | ◎ | ◎ | X | ◎ | ◎ |
| Electromagnetic wave shielding property |  | ◎ | ◎ | ◎ | ◎ | ◎ | ◎ | X | Δ |
| Electromagnetic wave shielding property over time under high temperature and high humidity |  | ○ | ◎ | ◎ | ◎ | ◎ | ◎ | X | ◎ |
| Crack resistance |  | Δ | ○ | ◎ | ◎ | ◎ | ◎ | Δ | X |
| Connection reliability of small opening via |  | ◎ | ◎ | ◎ | ○ | Δ | ◎ | X | ◎ |

According to the disclosure, the electromagnetic wave shielding sheet having excellent solder reflow resistance and crack resistance, capable of highly reliable ground-connection even with respect to the small opening via, and having a high electromagnetic wave shielding property even when used in the high frequency transmission circuit can be provided.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. An electromagnetic wave shielding sheet, comprising: a protection layer, a metal layer, and a conductive adhesive layer, wherein the metal layer is a metal foil or a metal film, and has a plurality of openings, and an aperture ratio of the openings is in a range of 0.1% or more to less than 6.5%; and the electromagnetic wave shielding sheet has a tensile breaking strength of 20 N/20 mm-80 N/20 mm.

2. The electromagnetic wave shielding sheet according to claim 1, wherein an average value of a circularity factor of the openings of the metal layer obtained by an expression below is 0.5 or more, circularity factor=(area×4π)/(perimeter)$^2$ herein, the perimeter is a length of an outer circumference when an image which is obtained by observing the metal layer by any one of an optical microscope, a laser microscope and an electron microscope is read, a plane of the opening becomes a direction perpendicular to an observation viewpoint, the opening capable of being entirely confirmed is extracted, and a extracted opening is projected two-dimensionally; and the area is a breadth of a region defined by the outer circumference when the extracted opening is projected two-dimensionally.

3. The electromagnetic wave shielding sheet according to claim 2, wherein a thickness of the metal layer is 0.5 μm-μm.

4. The electromagnetic wave shielding sheet according to claim 3, wherein the conductive adhesive layer contains a thermosetting resin and a conductive filler, and a content of the conductive filler in the conductive adhesive layer is 35 mass %-90 mass %.

5. The electromagnetic wave shielding sheet according to claim 2, wherein the conductive adhesive layer contains a thermosetting resin and a conductive filler, and a content of the conductive filler in the conductive adhesive layer is 35 mass %-90 mass %.

6. The electromagnetic wave shielding sheet according to claim 1, wherein a thickness of the metal layer is 0.5 μm-5 μm.

7. The electromagnetic wave shielding sheet according to claim 6, wherein the conductive adhesive layer contains a thermosetting resin and a conductive filler, and a content of the conductive filler in the conductive adhesive layer is 35 mass %-90 mass %.

8. The electromagnetic wave shielding sheet according to claim 1, wherein the conductive adhesive layer contains a thermosetting resin and a conductive filler, and a content of the conductive filler in the conductive adhesive layer is 35 mass %-90 mass %.

9. A printed wiring board comprising the electromagnetic wave shielding sheet according to claim 1, a cover coat layer, and a wiring board having signal wirings and an insulation base material.

10. The printed wiring board according to claim 9, wherein the signal wirings have signal circuits and ground circuits;

a via is arranged on the cover coat layer to expose the ground circuits; and an area of the via is 0.008 mm$^2$ or more and 0.8 mm$^2$ or less.

* * * * *